United States Patent
Constancias (10) Patent No.: US 7,781,128 B2
(45) Date of Patent: Aug. 24, 2010

(54) EXTREME ULTRAVIOLET PHOTOLITHOGRAPHY MASK, WITH ABSORBENT CAVITIES

(75) Inventor: Christophe Constancias, Grenoble (FR)

(73) Assignee: Commissariat a l'Energie Atomique (FR)

( * ) Notice: Subject to any disclaimer, the term of this patent is extended or adjusted under 35 U.S.C. 154(b) by 120 days.

(21) Appl. No.: 12/095,540

(22) PCT Filed: Nov. 23, 2006

(86) PCT No.: PCT/EP2006/068793

§ 371 (c)(1),
(2), (4) Date: Dec. 11, 2008

(87) PCT Pub. No.: WO2007/063021

PCT Pub. Date: Jun. 7, 2007

(65) Prior Publication Data
US 2010/0178596 A1 Jul. 15, 2010

(30) Foreign Application Priority Data
Dec. 2, 2005 (FR) .................................. 05 12255

(51) Int. Cl.
*G03F 1/00* (2006.01)
(52) U.S. Cl. ........................................................ 430/5
(58) Field of Classification Search ............... 430/5; 378/35; 359/353
See application file for complete search history.

(56) References Cited

U.S. PATENT DOCUMENTS

| 6,589,717 | B1 | 7/2003 | Ghandehari et al. |
| 6,593,037 | B1 | 7/2003 | Gabriel |
| 6,986,974 | B2 * | 1/2006 | Han et al. ................... 430/5 |
| 7,455,937 | B2 * | 11/2008 | Rolfson ...................... 430/5 |
| 2003/0027053 | A1 | 2/2003 | Yan |
| 2004/0142250 | A1 | 7/2004 | Stearns et al. |
| 2005/0147894 | A1 | 7/2005 | Lee |

FOREIGN PATENT DOCUMENTS

| JP | 2002313694 | 10/2002 |
| JP | 2004095980 | 3/2004 |

OTHER PUBLICATIONS

Sang-In Han et al. "Design and Method of Fabricating Phase Shift Masks for Extreme Ultraviolet Lithography by Parital Etching into the EUV Multilayer Mirror." Proceedings of the SPIE, vol. 5037 (2003).

* cited by examiner

Primary Examiner—Stephen Rosasco
(74) Attorney, Agent, or Firm—Lowe Hauptman Ham & Berner, LLP (57) ABSTRACT

The invention relates to extreme ultraviolet photolithography masks operating in reflection. These masks comprise a lower mirror (22) covering a substrate (20), and absorbent zones formed on the lower mirror in an etched pattern that defines the pattern to be reproduced. According to the invention, the absorbent zones are formed by resonant Fabry-Pérot cavities exhibiting a strong absorption peak for the operating wavelength. The cavities are formed by the lower mirror (22), an upper mirror (24) and, between the mirrors, a transparent medium, the thickness of which is calculated so as to produce an absorption peak at the operating wavelength. The medium may be formed from silicon (27) or by a superposition of a thin silicon oxide layer (forming a buffer layer to facilitate etching) and a silicon layer.

18 Claims, 4 Drawing Sheets

EXTREME ULTRAVIOLET PHOTOLITHOGRAPHY MASK, WITH ABSORBENT CAVITIES

CROSS-REFERENCE TO RELATED APPLICATIONS

The present Application is based on International Application No. PCT/EP2006/068793, filed on Nov. 23, 2006, which in turn corresponds to French Application No. 05 12255, filed on Dec. 2, 2005, and priority is hereby claimed under 35 USC §119 based on these applications. Each of these applications are hereby incorporated by reference in their entirety into the present application.

FIELD OF THE INVENTION

The invention relates to photolithography, and notably to photolithography at very short wavelengths. It relates more precisely to the structure of an extreme ultraviolet lithography mask intended for use in reflection.

BACKGROUND OF THE INVENTION

Photolithography is used to produce electronic optical or mechanical microstructures, or microstructures combining electronic and/or optical and/or mechanical functions. It consists in irradiating, with photon radiation, through a mask that defines the desired pattern, a photosensitive resist or photoresist layer deposited on a planar substrate (for example a silicon wafer). The chemical development that follows the irradiation reveals the desired patterns in the resist. The resist pattern thus etched may serve both for several purposes, the most common being the etching of an underlying layer (whether insulating or conducting or semiconducting) so as to define a pattern identical to that of the resist in this layer.

It is sought to obtain extremely small and precise patterns and to align etched patterns very precisely in multiple superposed layers. Typically, the critical dimension of the desired patterns is nowadays a fraction of a micron, or even a tenth of a micron and below. The wavelength of the light used in the photolithography operation limits the resolution—the shorter the wavelength, the finer the patterns may be. Ultraviolet photolithography (and wavelengths down to 193 nanometers) allows finer features to be produced than with visible light.

It is endeavoured at the present time to go well below these wavelengths and to work in extreme ultraviolet (EUV) at wavelengths between 10 and 14 nanometers. The objective is to obtain a very high resolution, while still maintaining a low numerical aperture and a sufficient depth of field (a few hundred nanometers).

However, at these wavelengths the materials forming the substrate of the mask are not transparent and the photolithography operation must use masks operating in reflection and not in transmission: the extreme ultraviolet light is projected onto the mask at a low angle of incidence (about 5 to 6 degrees); the mask comprises absorbent zones and reflecting zones; in the reflecting zones, the mask reflects the light onto the resist to be exposed, impressing its image thereon. The path of the light between the mask and the resist to be exposed passes via other reflectors, the geometries of which are designed so as to project a reduced image of the mask and not a full-size image. The image reduction makes it possible to etch smaller patterns on the exposed resist than those etched on the mask.

The mask itself is fabricated using a photolithography process followed by etching with a resist mask or a hard mask (for example made of silica, silicon nitride or chromium), this time in transmission and with a longer wavelength, permitted by the fact that the features are larger.

Typically, a reflection mask of the binary mask type is made up of a planar substrate covered with a continuous reflecting structure, in practice a Bragg mirror i.e. a structure consisting of multiple dielectric layers of different refractive indices, the thicknesses of which are calculated according to the indices, the wavelength and the angle of incidence, so that the various partially reflecting interfaces reflect light waves in phase with one another. This mirror is covered with an absorbent layer etched in the desired masking pattern so that the mask comprises reflecting zones (mirrors not covered with absorbent) and absorbent zones (mirrors covered with absorbent). To give an example, for a wavelength of 13.5 nm and an angle of incidence of 6 degrees, a reflectivity of 74% is achieved with forty silicon layers of 41.5 ångström (1 ångström=0.1 nm) thickness alternating with forty layers of molybdenum of 28 ångström thickness. The absorbent zones may consist (among others) of chromium deposited on the mirror. For example, a 600 ångström chromium layer placed on the above mirror now reflects only 1% of the incident light.

Among the drawbacks of this mask structure is notably the fact that the absorbent zones are thick (several hundred nanometers), resulting in not insignificant shadowing of the transitions between absorbent and reflecting zones in the presence of oblique or even low-angle (6°) illumination, and hence a loss of resolution.

It has also been proposed to produce the absorbent zones by locally hollowing out the surface of the mirror and filling the opening with an absorbent layer. The shadowing effect is reduced, but the process is very complex. The article "*Design and Method of Fabricating Phase Shift Masks for Extreme Ultraviolet Lithography by Partial Etching into the EUV Multilayer Mirror*" by Sang-In Han et al., in Proceedings of the SPIE, vol. 5037 (2003), describes such a structure.

Structures have also been proposed for what are called "EUV-PSM masks" (PSM standing for "Phase Shift Mask"). Openings are cut out in the mirror so as to locally reduce its thickness by a value such that the light reflected in the zones of reduced thickness are in phase opposition with the light reflected in the zones of nonreduced thickness. This creates, at the boundary, destructive interference equivalent to absorbent zones. If the reflection coefficient R2 in the zones of reduced thickness remains close to the reflection coefficient R1 in the zones of nonreduced thickness, (for example R2 equal to 85% of R1 or more), the term "H-PSM" (Hard Phase Shift Mask) is used. If one of the reflection coefficients is considerably lower than the other, the term "A-PSM" (Attenuated Phase Shift Mask) is used.

There are also what are called "Alt-PSM" masks or alternating phase shift masks in which two close reflecting zones are separated by an absorbent zone, the two successive reflecting zones producing reflections in phase opposition, thereby ensuring that the reflected light intensity systematically passes through zero in an absorbent zone.

All these mask structures are complex and therefore expensive to produce accurately, or else they create a substantial relief on the surface (and therefore shadowing in the presence of oblique illumination), in particular because of the necessary thickness of absorbent in the dark zones.

SUMMARY OF THE INVENTION

The object of the invention is to provide a mask structure that is improved over the mask structures of the prior art from the standpoint of the compromise between performance and production cost.

For this purpose, the invention provides an extreme ultraviolet photolithography mask operating in reflection, comprising a substrate, a multilayer reflecting structure deposited on the substrate and a pattern etched according to an image to be reproduced, characterized in that the etched pattern is defined by the presence of absorbent resonant optical cavities of the Fabry-Pérot type, comprising a transparent medium located between a lower mirror and a partially transparent upper mirror, and the transparent medium of the cavity comprising at least one layer of a material different from the materials constituting the multilayer reflecting structure.

The lower mirror is preferably formed directly by the reflecting multilayer structure deposited on the substrate.

The mask therefore comprises a pattern of reflecting zones (the structure reflecting at points where there is no absorbent resonant cavity) and absorbent zones (absorbent resonant cavities on top of the reflecting structure).

The fact that the material of the cavity is different from the material of the multilayer reflecting structure makes it possible in practice to produce such cavities, which would be very difficult to produce if the material of the cavity were the same as that of the mirrors. It would be preferable to choose as different material a material having good etch selectivity properties with respect to the layers of the reflecting structure.

A major advantage of the invention is that it is possible in this way, as will be explained in detail later on, to produce absorbent zones juxtaposed with reflecting zones with a very small relief on the surface of the mask, and hence very little shadowing when illuminated at oblique incidence: a few tens of ångströms in relief instead of several hundred ångströms, while still having a high reflection contrast between absorbent zones and reflecting zones. This is because the thickness of an absorbent resonant cavity may be much smaller than that of a simple absorbent layer.

A resonant cavity of the Fabry-Pérot type consists of two mirrors, at least one being partially transparent, which are separated by a certain optical distance in the direction of travel of the light, and a transparent space (i.e. one that is perfectly transparent or weakly absorbent) between the mirrors. The term "optical distance" is understood here to mean the sum of the various individual optical distances in each of the optical media through which the light passes in succession, each of these individual optical distances being the physical distance in the direction of travel of the light multiplied by the refractive index of the medium through which it passes. The cavity is resonant if the light directly reflected on the upper mirror is phase-shifted by a multiple of 180° with respect to the light that leaves the upper mirror after one round trip in the cavity, including a reflection on the lower mirror. If this is an odd multiple of 180°, the cavity is absorbent in the sense that the multiple reflections create destruction interference because they produce rays in mutual phase shift of 180° after round trips in the cavity. If this is an even multiple, the resonant cavity is reflecting, the light emanating from multiple reflections in the cavity generating waves in phase with the principal reflection, and therefore constructive interference. This resonance situation may be obtained with a short distance between mirrors (of around 40 ångströms or wavelengths of around 135 ångströms).

The space separating the mirrors is filled with one or more transparent or weakly absorbent materials, at least one of which being different from the materials of the lower mirror. Consequently, in the description which follows, the word "cavity" is taken in the sense of an "optical" cavity—this word therefore does not denote any empty space containing no filling material.

The mirrors of a resonant cavity, both the lower mirror and the upper mirror, may be multilayer structures of the Bragg mirror type, the multilayer reflecting structure deposited uniformly on the mirror being such a Bragg mirror.

The upper mirror of the cavity, which in use is located on the side facing the entry of an incident ray, is partially transparent; the other is preferably highly reflecting.

The amount of light reflected at the operating wavelength depends on the thickness D of the cavity, the angle of incidence $\theta$ of the light, the propagation index of the material contained in the cavity (complex index, n, k where n is the refractive index and k the attenuation coefficient) and, of course, the reflection and transmission coefficients of the mirrors of the cavity.

The thickness of the transparent medium, between the two mirrors, for an absorbent cavity is, according to theory, an odd multiple of a quarter-wavelength divided by the refractive index n and by the cosine of the angle of incidence $\theta$ of the EUV light in use. This is the condition for the optical distance corresponding to one round trip of the light in the space lying between the mirrors to cause a 180° phase shift relative to the principal reflection.

In a first embodiment, the cavities are produced with two superposed layers of different materials between the two mirrors. The lower layer may be present both in the cavities and outside the cavities, that is to say both in the absorbent zones and in the reflecting zones of the mask. Preferably, it is at least this lower layer that is made of a material different from the materials of the multilayer reflecting structure. Preferably it is etched little by the etchants used for etching the materials serving to form the upper mirror.

Preferably, the upper mirror extends not only on top of the cavities but also away from the location of the cavities, on top of the multilayer reflecting structure deposited on the substrate. This is because, by constituting the upper mirror like the lower mirror, i.e. using a Bragg multilayer structure, the superposition of the multilayer reflecting structures of the lower mirror and of the upper mirror, at the point where there is no absorbent cavity interposed between the mirrors, constitutes itself a reflecting structure.

In a second embodiment, absorbent resonant cavities are juxtaposed with reflecting resonant cavities so as to constitute the etched pattern of absorbent and reflecting zones. The multilayer reflecting structure deposited on the substrate constitutes a lower reflecting wall for both types of cavity. A partially transparent upper mirror is formed on top of the absorbent cavities and the reflecting cavities.

Preferably, the thickness of the medium located between the upper mirror and the lower mirror is the same for both types of cavity, the materials making up the transparent medium of the cavities having different refractive indices and the thickness of the medium having a value such that the curve of variation of the reflectivity of the absorbent cavities as a function of the thickness has an absorption peak close to this thickness value, the reflectivity of the reflecting cavities being at least 50% for this value.

Still other objects and advantages of the present invention will become readily apparent to those skilled in the art from the following detailed description, wherein the preferred embodiments of the invention are shown and described, simply by way of illustration of the best mode contemplated of carrying out the invention. As will be realized, the invention is capable of other and different embodiments, and its several details are capable of modifications in various obvious aspects, all without departing from the invention. Accordingly, the drawings and description thereof are to be regarded as illustrative in nature, and not as restrictive.

BRIEF DESCRIPTION OF THE DRAWINGS

The present invention is illustrated by way of example, and not by limitation, in the figures of the accompanying drawings, wherein elements having the same reference numeral designations represent like elements throughout and wherein.

DETAILED DESCRIPTION OF THE INVENTION

Figure 1:
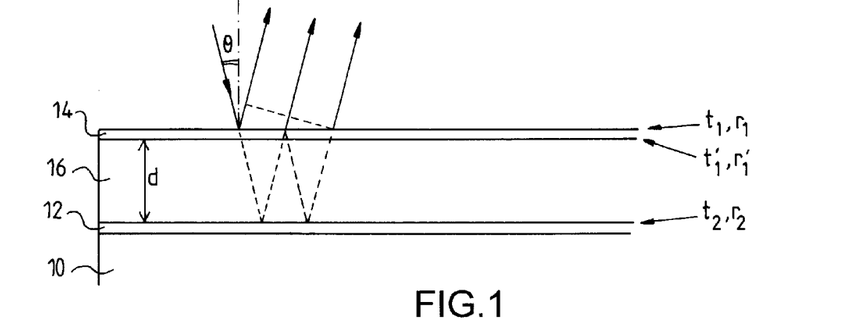
FIG. 1 shows schematically the principle of a Fabry-Pérot resonant cavity operating in reflective mode.

FIG. 1 is a reminder of the principle of a Fabry-Pérot resonant cavity operating in reflective mode, the outgoing radiation from the cavity being on the same side of the cavity as the incoming radiation.

This figure shows a substrate 10 on which a lower mirror 12, assumed to be perfectly reflecting, and then an upper mirror 14, which is partially reflecting and partially transparent, have been deposited, the second mirror being separated from the first by a distance d, and the space 16 between the two mirrors being empty or filled with a transparent or weakly absorbent material of refractive index n.

The incident light rays pass through the upper mirror 14 in the cavity, before passing back through the cavity and the mirror after reflection on the lower mirror 12. The optical path length followed by the rays is then a function of the distance d, the index n and the angle of incidence θ.

The overall reflection coefficient depends on the transmission and reflection coefficients at each interface, namely t1, r1 at the interface between the upper mirror 14 and the external medium, t'1, r'1 at the interface between the mirror 14 in the cavity, and t2, r2 at the interface between the cavity in the lower mirror.

The cavity is resonant and absorbent if the multiple reflections generate destructive interference, that is to say, if the rays reflected after one round trip in the cavity are phase-shifted by 180° (an odd multiple of the half-wavelength) with the rays that are directly reflected without passing through the cavity. The resonance condition in maximum absorption therefore sets a cavity thickness d, this being:

$$d=(2m+1)\lambda/4n \cos \theta$$

where m is an integer, λ is the wavelength and θ is the angle of incidence of the light.

In contrast, the cavity is resonant and reflecting if the multiple reflections generate constructive interference, that is to say, if the rays reflected after one round trip in the cavity are phase-shifted by 360° (an even multiple of the half-wavelength) with the rays that are directly reflected without passing through the cavity. The resonance condition in maximum reflection therefore sets a cavity thickness d, this being:

$$d=2m\lambda/4n \cos \theta.$$

Reflectivity curves as a function of thickness at a given wavelength, or as a function of the operating wavelength for a given thickness, therefore have alternating reflectivity peaks and absorption peaks representing the resonance in reflection and the resonance in absorption respectively.

These resonance condition values are theoretical values, it being possible for the experimental values to be slightly different, without the principle changing, notably as a function of the construction of the mirrors. In particular, the mirrors may be formed by Bragg multilayer structures and the conditions for obtaining resonance must take account of this fact, since it is not possible to consider that the reflection in a multilayer mirror occurs exactly at the surface of the upper layer. To simplify the explanations, it will nevertheless be assumed that the distance between the mirrors is governed by the above formulae for obtaining resonance.

Figure 2:
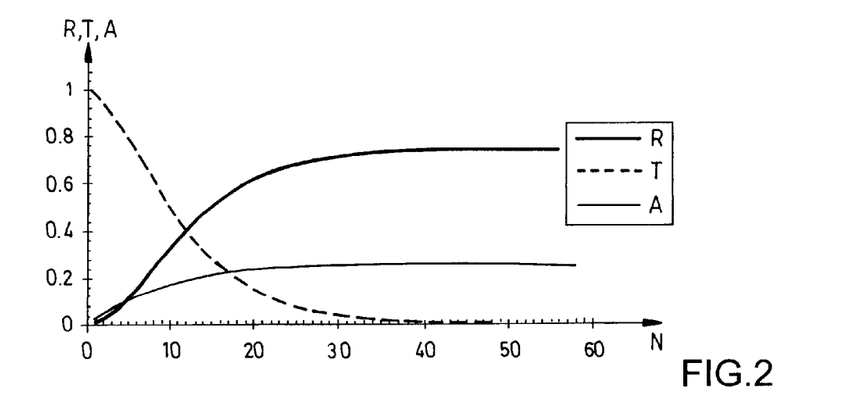
FIG. 2 shows typical reflectance, transparency and absorption curves for a multilayer mirror structure.

The reflectivity and the transparency of the multilayer structures depend on the number of layers. FIG. 2 shows an example of the reflectivity and transparency curves for structures consisting of alternating silicon (41.5 ångström) and molybdenum (28 ångström) layers for a wavelength of 13.5 nanometers (preferred according to the invention) and an angle of incidence of 6°, as a function of the number N of pairs of layers. The reflectivity R, the transparency T and the absorption A are depicted. The figure shows that the reflectivity and the transparency are approximately the same for N=12 pairs of layers. The upper mirror 14 can be produced with twelve pairs of layers if it is desired for this to be 50% reflective.

In what follows, the numerical data will be based on a choice of 13.5 nanometers for the wavelength and 6° for the angle of incidence.

Figure 3:
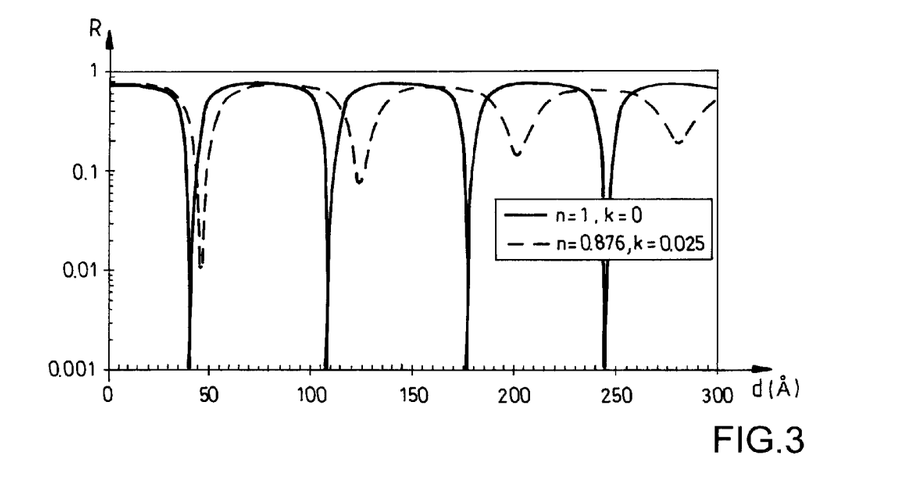
FIG. 3 shows reflectivity curves for a Fabry-Pérot cavity as a function of the distance d separating the two mirrors of the cavity.

FIG. 3 shows the reflectivity R of the overall Fabry-Pérot cavity as a function of the distance d when the cavity is produced with a semitransparent upper mirror consisting of twelve pairs of Si (41.5 ångström)/Mo (28 ångström) layers and with a lower mirror consisting of 30 pairs of layers (of the same thicknesses). These mirrors are Bragg mirrors and the thicknesses of 41.5 and 28 ångströms are thicknesses that correspond to optical phase shifts that are multiples of a half-wavelength, taking into account the different optical indices of the two materials and taking into account the intended angle of incidence (6°), so that the multiple layers act as a mirror, establishing multiple reflections all in phase at the output of the mirror.

FIG. 3 shows two curves:
one, shown by the solid lines, with an empty or air-filled cavity (index 1, attenuation 0); and
the other, shown by the dashed lines, with a cavity assumed to be filled with a weakly absorbent material supposed to have a propagation index n=0.876, k=0.025.

It has been found that the structure shown in FIG. 1 has absorption peaks (very low reflection) for certain values of the distance d. They would be reflected by absorption peaks for the operating wavelength if the curves as a function of the thickness d were plotted as a function of the wavelength.

These peaks are more pronounced when the medium of the cavity has a zero attenuation k (solid curve). They are less pronounced, but nevertheless exist, when there is attenuation in the cavity (dashed curve). In the case shown, which corresponds to an upper mirror consisting of twelve layers, the first peak is the highest, the following ones becoming less and less pronounced. But with another number of layers of the upper mirror the situation could be different. In the example shown with the dashed curve, the reflectivity is now only 1% at the bottom of the peak, whereas it is about 70% between the peaks.

It may also be seen that the distance d giving a peak may be small (about 40 ångströms for the first peak, 100 ångströms for the second). Finally, it should be noted that the position of the peaks is shifted to the right if the refractive index n decreases, since the distance d that gives rise to absorbent resonance is inversely proportional to n.

Figure 4:
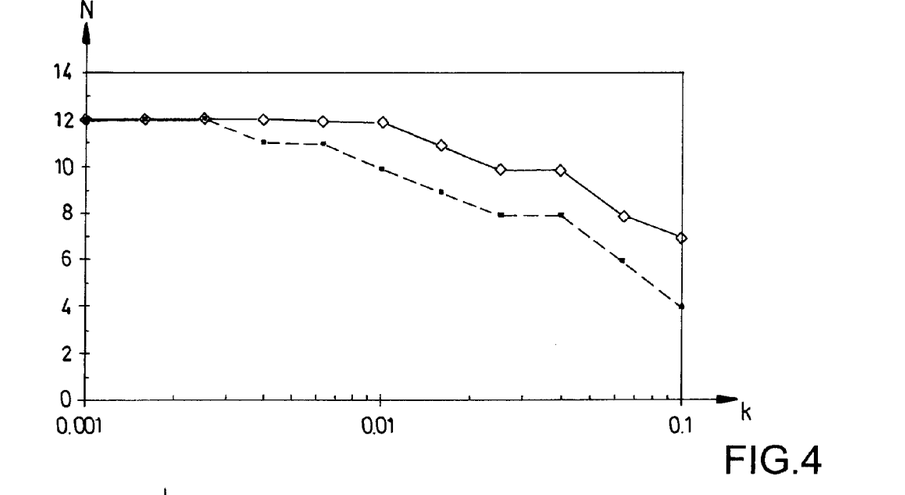
FIG. 4 shows curves of the optimum number of layers of the upper mirror structure of the cavity as a function of the attenuation coefficient of the medium lying between the two mirrors.

It has also been attempted to see what influence the attenuation coefficient k of the material of the cavity has on the depth of the absorption peak and it has been found that, in order to have a sufficiently deep absorption peak even with nonzero attenuation coefficients, it may be useful to modify the number of pairs of layers of the upper mirror. The curve in FIG. 4 shows the optimum number of pairs of layers for having a peak with a reflectivity of less than 1%, as a function of k. For example, for k=0.03 the optimum number of layers is somewhat equal to ten (solid curve). The dashed curve in FIG. 4 corresponds to the first absorption peak (at around 45 ångströms) in the type of curve shown in FIG. 3. The dashed curve in FIG. 4 corresponds to the second peak (at around 120 ångströms).

Starting from these observations, a mask is constructed with reflective zones consisting of conventional multilayer mirror zones but with the nonreflecting zones consisting of resonant optical cavities designed to produce deep absorption peaks.

Figure 5:
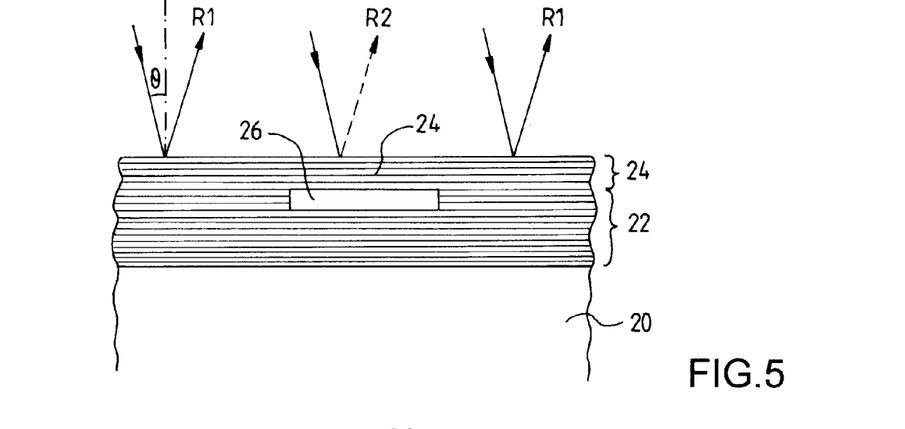
FIG. 5 shows the principle of a binary mask with an empty or air-filled cavity.

In the example shown in FIG. 5—the simplest from the theoretical standpoint—the cavity is empty or filled with air, i.e. the index is 1, and the attenuation is zero or negligible. The mask comprises a substrate 20 on which a highly reflecting uniform lower mirror 22 preferably consisting of at least thirty pairs of alternating Si (41.5 ångström)/Mo (28 ångström) layers have been deposited, followed by a partially transparent upper mirror 24 consisting of twelve pairs of layers which, advantageously so as to simplify the technology, are identical to the pairs of the lower mirror. These numerical values are tied to the choice of a preferred wavelength of 13.5 nanometers and a preferred angle of incidence of about 6°, which are adopted for all the examples given in this description. With another wavelength and another angle of incidence, it would be necessary to choose other values in order to meet the Bragg condition and obtain reflecting mirrors.

In general, a person skilled in the art will determine the thicknesses of the layers of the stack using Bragg's law.

In the mask zones that have to be absorbent, a space 26 having a thickness close to 40 ångströms is provided between the lower mirror and the upper mirror. This 40-ångström space corresponds to the first absorption peak of the solid curve in FIG. 3. The reflectivity R1 of the direct superposition of the mirrors 22 and 24 is very high (about 75%), owing to the 42 superposed pairs of identical layers. The reflectivity R2 of the structure with a resonant cavity formed by the space 26 between the mirrors is very low (less than 0.1%) because it is placed in the absorption peak of the cavity. It should be noted in accordance with what was stated above that, owing to the use of multilayer mirrors, the distance d between mirrors is not exactly obtained by the formula d=$\lambda/4n$ cos θ, which would instead give 34 ångströms.

In practice, cavities will be produced that are not empty or filled with air, but cavities filled with a solid material, since these are easier to produce and materials highly transparent to EUV exist. It should be noted that an empty cavity may be produced by firstly depositing the upper mirror, then depositing, and etching to the shape of the cavity, a temporary filling material, then by depositing the upper mirror and, finally, by removing the temporary material via lateral apertures. To do this, the filling material must be able to be etched without damaging the layers making up the mirrors.

Figure 6:
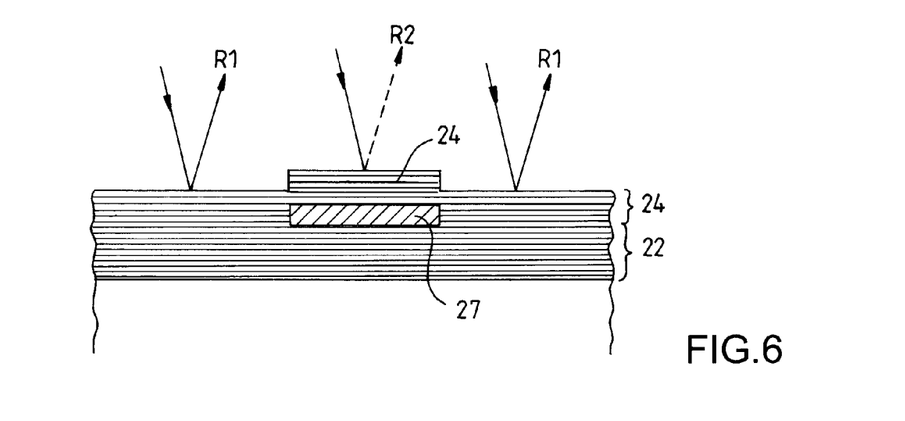
FIG. 6 shows one embodiment of the invention in which the cavity is filled with a transparent material.

FIG. 6 shows one embodiment in which the cavity is formed from a transparent material 27 having a thickness of about 40 ångströms if the index of the material is very close to 1, or having a different thickness if the index is far from 1. The lower mirror 22 again has thirty pairs of alternating Si (41.5 ångström)/Mo (28 ångström) layers. The upper mirror 24 has twelve pairs of alternating layers identical to those of the mirror 22. This layer 24 covers both the material 27, at the point where it is present, and the lower mirror 22 at the point where the material 27 is not present. The reflectivity R1 in the regions where there is no material 27 is high (around 75%) because of the 42 pairs of superposed identical layers. At the point where the material 27 is, the reflectivity R2 is very low if the thickness is chosen so as to form an absorbent resonant cavity.

The material chosen must meet the following criteria: very low absorption, and, most particularly, ease of selective etching with respect to the materials (molybdenum and silicon) that make up the lower multilayer structure. Silicon oxide may be suitable.

It may be seen that the relief introduced on the surface of the mask between the reflecting (reflectivity R1) zones and the absorbent (reflectivity R2) zones is very slight, since the difference in height is equal to the thickness of the medium 27 of the cavity, typically about 40 ångströms. The shadowing effect is accordingly very slight.

The mask shown in FIG. 6 is particularly simple to produce since it consists in depositing the multilayer lower mirror, then in depositing a layer of material 27, then in etching this layer, so as to leave it remaining only in the zones that have to be absorbent, and finally in uniformly depositing the upper mirror, without it being necessary to etch this.

Figure 7:
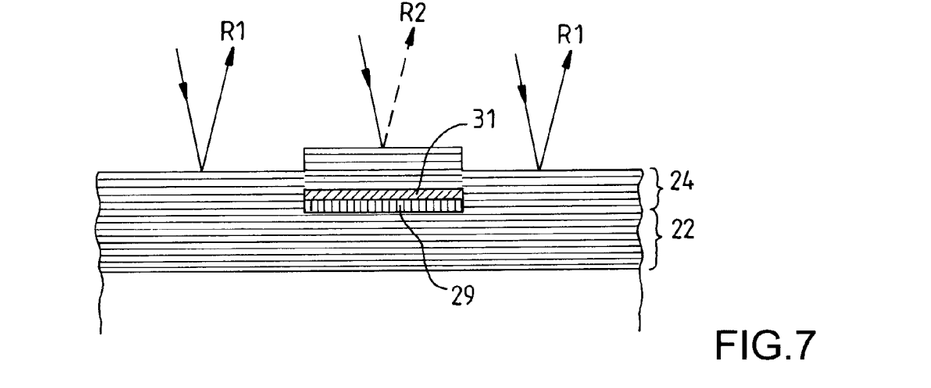
FIG. 7 shows an embodiment similar to FIG. 6, but in which the material filling the cavity is formed by the superposition of two layers of different material.

FIG. 7 shows an embodiment in which the medium that separates the two mirrors from the cavity is formed by two layers of different materials, both transparent or weakly absorbent at the operating wavelength. The superposition of transparent layers between two mirrors again behaves as an optical cavity, which is resonant and has an absorption peak if the optical distance traveled by the light in one round trip through the two layers meets the resonance conditions indicated above (based on optical paths that are odd multiples of the wavelength).

The advantage of this double layer is mainly the assistance in etching the reflecting and absorbent features of the mask even if the second layer of this superposition is made of silicon (or molybdenum). In this case, as lower layer 29, a buffer layer will be chosen that constitutes an etching stop layer when the upper layer 31 is etched so as to define the pattern of cavities. This buffer layer is not etched, or barely etched, by the etchant for etching the upper layer and, in addition, it is desirable that said buffer layer itself be able to be etched by an etchant that does not etch the surface of the lower mirror 22 of the mask. Silicon oxide is very suitable.

In the example shown in FIG. 7, the fabrication process comprises the uniform deposition of the layers of the lower mirror 22 (for example thirty pairs of Si/Mo layers), then the uniform deposition of the layers 29 and 31, then the etching of the layer 31, to define the locations of the absorbent resonant cavities, then the removal of the layer 29, at the point where this is no longer protected by the layer 31, and then the uniform deposition of the layers of the upper mirror 24 (for example twelve pairs of Si/Mo layers), both outside the resonant cavities and above the cavities. The lower layer 29 may be made of silicon oxide with a thickness of about 20 ångströms and the upper layer 31 may be made of silicon with a thickness of about 20 ångströms (preferably with an upper mirror 24 consisting of thirteen layers) or made of chromium with a thickness of about 23 ångströms (preferably with an upper mirror consisting of ten pairs of Si/Mo layers). The deposition of this double layer therefore requires additional steps over the process described with regard to FIG. 6 (deposition of the layer 29 before the layer 31, followed by removal of this layer 29 after the layer 31 has been etched), but damage to the lower mirror is avoided.

Figure 8:
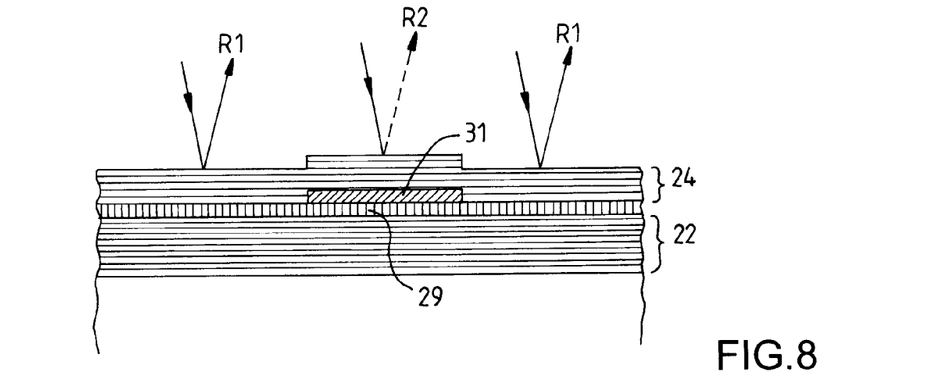
FIG. 8 shows an embodiment similar to FIG. 7, but in which the lower layer of the superposition extends not only in the cavity but also to the outside of the cavity.

In the embodiment shown in FIG. 8, the lower layer 29 is not removed after etching the layer 31. It therefore remains and the upper mirror 24 is deposited uniformly both on top of the layer 29 outside the islands of layer 31 and on top of the islands of layer 31. The layer 29 therefore in this case does not need to be able to be etched by an etchant that does not etch the lower mirror 22.

It should be noted that in the embodiment shown in FIG. 8 the step difference between the reflecting zones and the absorbent zones may be even smaller than in the embodiments shown in FIGS. 6 and 7, since it is limited to the thickness of the layer 31, for example 20 ångströms. The shadowing during use is correspondingly reduced.

This arrangement may have the drawback of slightly reducing the reflectivity R1 of the mask in the reflecting zones, but the surface of the lower mirror 24 is better protected since it remains covered by a thin silicon oxide layer. The loss of reflectivity R1 in the reflecting zone may be minimized by giving the layer 29 itself a thickness which will establish a reflecting resonant cavity (optical path an even multiple of the quarter-wavelength) in the lower mirror 22/layer 29/upper mirror 24 superposition. This will therefore have an overall reflectivity located within a reflectivity peak for the operating wavelength, despite the presence of the buffer layer. Typically in this case, the thickness of the layer 29 will be about 75 to 80 ångströms for a silicon oxide buffer layer. The thickness of the layer 31 will then be around 40 ångströms and not 20 ångströms in order for the layer 31/layer 29 stack to continue to meet the absorption peak condition at the point where there are islands 31.

Figure 9:
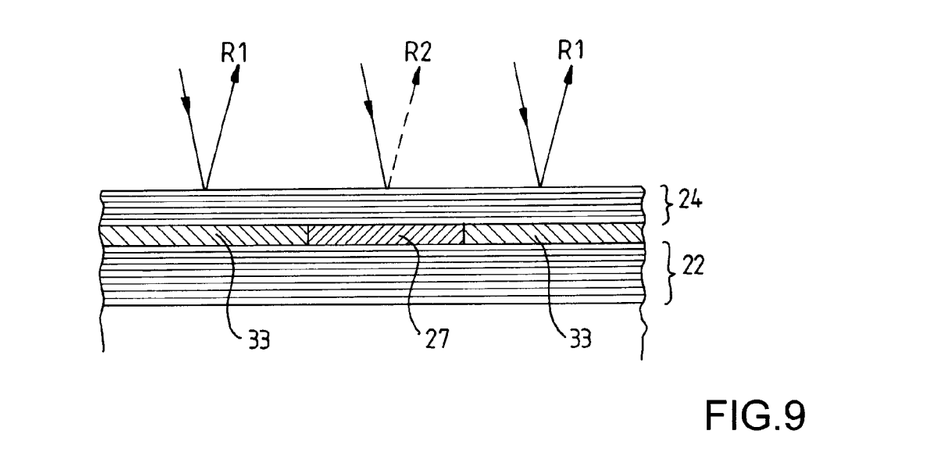
FIG. 9 shows an embodiment in which the reflecting zones and the absorbent zones of the mask are formed by Fabry-Pérot resonant cavities producing constructive interference and destructive interference respectively.

FIG. 9 shows another embodiment in which an absorbent resonant cavity is used to define the dark zones of the binary mask (low reflectivity R2), a reflecting resonant cavity (high reflectivity R1) is used to define the reflecting zones of the mask and the step difference between the dark zones and the reflecting zones are preferably reduced to zero, using cavities of the same thickness for these zones. To achieve this, it is necessary to choose materials having different refractive indices such that, for the same thickness d, the absorbent (destructive interference) resonance condition applies in the case of one of the cavities and the reflecting (constructive interference) resonance condition applies in the case of the other. Since one of the conditions relies on the fact that d is proportional to (2m+1) and the other to the fact that d is proportional to 2m, it is necessary for the indices n and n' of the materials chosen to be in a 2m/2m+1 or 2m/2m−1 ratio, where m is an integer.

Now, it is possible to find pairs of materials that meet these criteria and the thickness values d that it is necessary to choose may be checked experimentally so that this common thickness does lead to a high contrast between reflecting zones and absorbent zones. One and the same upper mirror 24, uniformly deposited, uncovers the two types of cavities which moreover use the same lower mirror 22.

It is particularly interesting to note that there is then no longer a step between the dark zones (cavities filled with a first material 27) and the reflecting zones (cavities filled with a material 33), and therefore no shadowing effect, and that, in addition, the phase of the light in the reflecting zones is overall opposed to the phase of the light in the absorbent zones, which means that a mask is produced that possesses both the properties of a highly binary mask (with very contrasted reflections R1 and R2) and the properties of a phase shift mask (abrupt transition with destructive interference in the transition zone).

Here again, the material of the absorbent cavity must include, according to the invention, at least one layer of a material different from the materials of the reflecting multilayer structure, and preferably a material that can be etched by an etchant that does not etch the multilayer structure.

Examples of suitable materials may be given:

For example if m=3, it is necessary to have two materials whose indices are approximately in a 7/6 or 5/6 ratio. This is the case for the silicon/palladium pair at a wavelength of 13.5 nanometers: the ratio is close to 7/6. It is possible to have a mask having highly reflecting silicon zones and highly absorbent palladium zones. This is because, with a thickness of 6 times $\lambda/4n \cos \theta$ for silicon (m=3) and a thickness of 5 times $\lambda/4n \cos \theta$ for palladium (m=2), i.e. about 200 ångströms, the absorbent resonance condition for palladium and the reflecting resonance condition for silicon are obtained. The same applies for a thickness of about 277 ångströms with m=4 for silicon and m=3 for palladium.

These numerical values must be brought face to face with the experimental results, and are dependent on the constitution of the upper mirror. This is because the number of layers of the upper mirror must be adjusted according to the nature of the materials used for the resonant cavities. In the last example above, the upper mirror consists of four pairs of layers.

Figure 10:
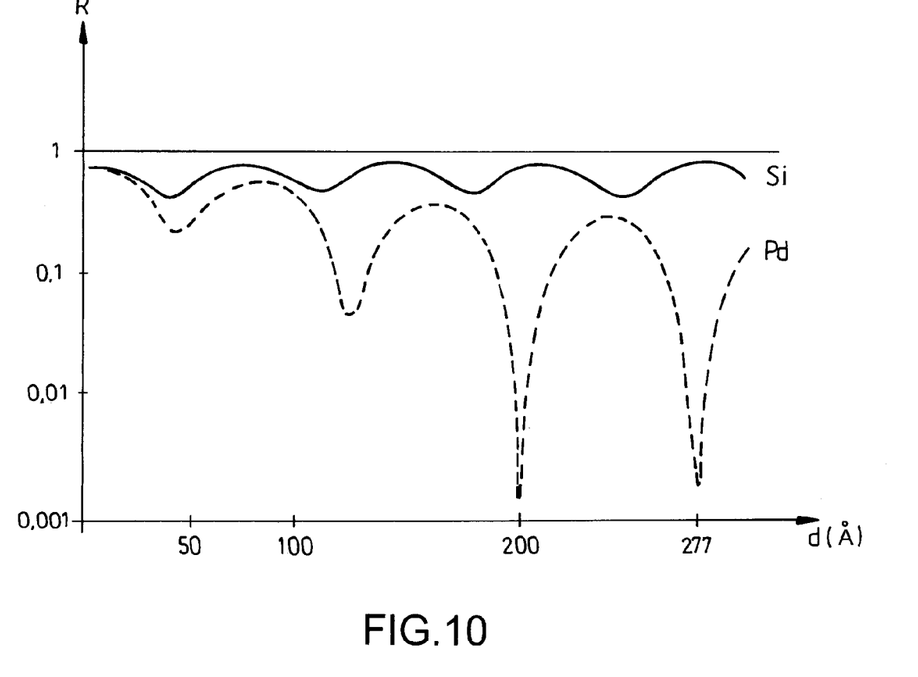
FIG. 10 shows a reflectivity curve explaining the principle of the embodiments such as those in FIG. 9.

To give an example, FIG. 10 shows reflectivity curves for resonant cavities produced in the following manner: lower mirror as above consisting of thirty pairs of Mo (28 ångström)/Si (41.5 ångström) layers; cavity medium made of silicon (solid curve) or palladium (dashed curve); upper mirror consisting of four pairs of alternating Si/Mo layers. The curves are plotted as a function of the thickness d of the cavity.

These curves show that the absorption peaks of the palladium cavity become increasingly pronounced when the thickness d increases and that there are two very deep absorption peaks for cavity thicknesses of 200 ångströms and 277 ångströms. For these thicknesses, the reflectivity of the silicon cavity (which varies slightly with thickness) is somewhat higher in value (about 70 to 75%). It is therefore possible to produce a mask with alternating silicon (reflecting) cavities and palladium (absorbent) cavities of 200 or 277 ångström thickness and an upper mirror with a small number of pairs of layers (preferably 4 or 5 Mo/Si pairs).

More generally, it is necessary to select materials that have indices in 2m/(2m+1) or 2m/(2m−1) ratios: for example, titanium for the first material and silver, platinum or ruthenium for the other material, with a value of m=7 and a common thickness of about 535 ångströms, since the ratio of the indices of these materials is 14/15. In this case, the zones with titanium become absorbent.

It is also possible to give the example of the following pairs: first material (absorbent zones): W, NbO, Cr, Nb; second material (reflecting zones): Ru, Ag, Pt; index ratio 20/21 (m=10); common thickness: about 765 ångströms.

The fabrication of a mask in accordance with FIG. 9 therefore comprises the following steps: uniform deposition of the successive layers of the lower mirror 22; then deposition of a first material serving as one of the types of cavity, for example the material 27 that defines the absorbent cavities; then etching of the material 27 (in this case, the material 27 may be formed from several layers 29, 31 as explained with reference to FIGS. 7 and 8 if this makes etching easier); then deposition of the material 33 of the second type of cavity; then removal, by mechanical and chemical erosion, of the additional thicknesses formed by the material 33 at the point where it covers the material 27, so as to make the latter flush and obtain a planar surface where the layers 27 and 33 have the same thickness; and, finally, uniform deposition of the layers of the upper mirror 27 on the uniform planar surface of the layers 27 and 33.

Thus, masks operating in reflection in extreme ultraviolet have been described that are improved from the standpoint of the shadowing effect.

It will be readily seen by one of ordinary skill in the art that the present invention fulfils all of the objects set forth above. After reading the foregoing specification, one of ordinary skill in the art will be able to affect various changes, substitutions of equivalents and various aspects of the invention as broadly disclosed herein. It is therefore intended that the protection granted hereon be limited only by definition contained in the appended claims and equivalents thereof.

The invention claimed is:

1. An extreme ultraviolet photolithography mask operating in reflection, comprising:
   a substrate, a multilayer reflecting structure deposited on the substrate and a pattern etched according to an image to be reproduced, wherein the etched pattern is defined by the presence of absorbent resonant optical cavities of the Fabry-Pérot type, each cavity comprising a transparent medium located between a reflecting lower mirror and a partially transparent upper mirror, and the transparent medium of the cavity comprising at least one layer of a material different from the materials constituting the multilayer reflecting structure.

2. The mask as claimed in claim 1, wherein the multilayer reflecting structure constitutes the lower mirror of the cavities.

3. The mask as claimed in claim 2, wherein the upper mirror is a second multilayer structure of the Bragg mirror type.

4. The photolithography mask as claimed in claim 1, wherein said layer of different material possesses properties of being etch-selective with respect to the layers constituting the multilayer reflecting structure.

5. The photolithography mask as claimed in claim 1, wherein said layer of different material is a silicon oxide layer.

6. The photolithography mask as claimed in claim 1, wherein the transparent medium of the resonant cavity is formed by the superposition of at least two transparent or weakly absorbent layers of different materials on which the upper mirror rests, the lower layer being said layer of material different from the materials of the reflecting structure.

7. The photolithography mask as claimed in claim 6, wherein the lower layer of the superposition of layers making up the transparent medium of the cavity extends on top of the multilayer reflecting structure deposited on the substrate, both in the cavities and outside the cavities.

8. The photolithography mask as claimed in claim 7, wherein the thickness of the lower layer of the superposition is chosen in such a way that the superposition, of the lower mirror, the lower layer and the upper mirror, forms a Fabry-Pérot reflecting resonant cavity having a reflectivity peak for the operating wavelength.

9. The photolithography mask as claimed in claim 1, wherein, in the reflecting zones, the upper mirror is superposed directly on the lower mirror.

10. The photolithography mask as claimed in claim 6, wherein the two layers comprise a silicon oxide lower layer and a silicon or chromium upper layer.

11. The photolithography mask as claimed in claim 1, comprisinq an etched pattern formed by absorbent resonant cavities juxtaposed with reflecting resonant cavities, the reflecting structure deposited on the substrate constituting a lower wall for these cavities, and one and the same partially transparent upper mirror being formed on top of the absorbent cavities and the reflecting cavities.

12. The photolithography mask as claimed in claim 10, wherein the thickness (d) of the medium located between the upper mirror and the lower mirror is the same for both types of cavity, the materials making up the transparent medium of the cavities having different refractive indices and the thickness having a value such that the curve of variation of the reflectivity of the absorbent cavities as a function of the thickness has an absorption peak close to this value, the reflectivity of the reflecting cavities being at least 50% for this value.

13. The photolithography mask as claimed in claim 2, wherein said layer of different material possesses properties of being etch-selective with respect to the layers constituting the multilayer reflecting structure.

14. The photolithography mask as claimed in claim 4, wherein said layer of different material possesses properties of being etch-selective with respect to the layers constituting the multilayer reflecting structure.

15. The photolithography mask as claimed in claim 2, wherein the transparent medium of the resonant cavity is formed by the superposition of at least two transparent or weakly absorbent layers of different materials on which the upper mirror rests, the lower layer being said layer of material different from the materials of the reflecting structure.

16. The photolithography mask as claimed in claim 3, wherein the transparent medium of the resonant cavity is formed by the superposition of at least two transparent or weakly absorbent layers of different materials on which the upper mirror rests, the lower layer being said layer of material different from the materials of the reflecting structure.

17. The photolithography mask as claimed in claim 2, comprising an etched pattern formed by absorbent resonant cavities juxtaposed with reflecting resonant cavities, the reflecting structure deposited on the substrate constituting a lower wall for these cavities, and one and the same partially transparent upper mirror being formed on top of the absorbent cavities and the reflecting cavities.

18. The photolithography mask as claimed in claim 3, comprising an etched pattern formed by absorbent resonant cavities juxtaposed with reflecting resonant cavities, the reflecting structure deposited on the substrate constituting a lower wall for these cavities, and one and the same partially transparent upper mirror being formed on top of the absorbent cavities and the reflecting cavities.

* * * * *